United States Patent [19]

Bartko et al.

[11] 4,278,475
[45] Jul. 14, 1981

[54] FORMING OF CONTOURED IRRADIATED REGIONS IN MATERIALS SUCH AS SEMICONDUCTOR BODIES BY NUCLEAR RADIATION

[75] Inventors: John Bartko, Monroeville; Earl S. Schlegel, Plum Borough, both of Pa.

[73] Assignee: Westinghouse Electric Corp., Pittsburgh, Pa.

[21] Appl. No.: 936

[22] Filed: Jan. 4, 1979

[51] Int. Cl.$^3$ .................... H01L 21/263; H01L 7/54; H01L 21/22

[52] U.S. Cl. .................................. 148/1.5; 148/33.5; 357/37; 357/39; 357/91; 427/35

[58] Field of Search .................. 148/1.5, 33.5; 357/37, 357/39, 91; 427/35

[56] References Cited

U.S. PATENT DOCUMENTS

| | | | |
|---|---|---|---|
| 3,718,502 | 2/1973 | Gibbons | 117/212 |
| 3,897,276 | 7/1975 | Kondo | 148/1.5 |
| 3,924,136 | 12/1975 | Heynick et al. | 250/492 A |
| 3,967,982 | 7/1976 | Arndt et al. | 148/1.5 |
| 4,014,718 | 3/1977 | Tomozawa et al. | 148/187 |
| 4,021,837 | 5/1977 | Hutson | 357/39 |
| 4,025,365 | 5/1977 | Martin et al. | 148/1.5 |
| 4,035,655 | 7/1977 | Guernet et al. | 250/492 A |
| 4,043,837 | 8/1977 | Cresswell et al. | 148/1.5 |
| 4,047,976 | 9/1977 | Bledsoe et al. | 148/1.5 |
| 4,056,408 | 11/1977 | Bartko et al. | 148/1.5 |
| 4,098,917 | 7/1978 | Bullock et al. | 427/36 |
| 4,111,720 | 9/1978 | Michel et al. | 148/1.5 |
| 4,118,251 | 10/1978 | Murrmann et al. | 148/1.5 |
| 4,134,778 | 1/1979 | Sheng et al. | 148/1.5 |
| 4,137,457 | 1/1979 | Krimmel | 250/492 A |
| 4,145,233 | 3/1979 | Sefick et al. | 148/1.5 |

FOREIGN PATENT DOCUMENTS 886232  1/1962  United Kingdom .................. 148/1.5

*Primary Examiner*—L. Dewayne Rutledge
*Assistant Examiner*—Upendra Roy
*Attorney, Agent, or Firm*—C. L. Menzemer

[57] ABSTRACT

Irradiated regions are formed in materials such as semiconductor bodies by nuclear radiation where the irradiated regions are of a desired thickness, dosage and dosage gradient, a desired distance from a selected surface of the material. A nuclear radiation beam from a given radiation source radiating particles with molecular weight of at least one (1) is provided that can penetrate the material through a selected surface to a depth greater than the maximum depth of the irradiated region from the selected surface. A beam modifier is formed of a given material and non-uniform shape to modify the energy of the radiation beam on transmission therethrough to form a transmitted radiation beam capable of forming an irradiated region of a desired thickness and dosage gradient in the material a given distance from the selected surface on irradiation of the material through the selected surface with the transmitted radiation beam. The material in which the desired irradiated region is to be formed is positioned with the selected surface thereof to be exposed to the radiation beam from the radiation source on transmission through the beam modifier. The material is thereafter irradiated through the beam modifier and through the selected surface with the radiation beam, preferably while the beam modifier and material are moved relative to each other through a predetermined motion, to form in the material an irradiated region of desired thickness, dosage and dosage gradient, a desired distance from the selected surface. The irradiated region thus formed in semiconductor bodies are particularly of value in changing the electrical characteristics without substantial change of other electrical characteristics.

110 Claims, 13 Drawing Figures

FORMING OF CONTOURED IRRADIATED REGIONS IN MATERIALS SUCH AS SEMICONDUCTOR BODIES BY NUCLEAR RADIATION

BACKGROUND OF THE INVENTION

Field of the Invention

The present invention relates to the making of irradiated regions in materials such as semiconductor bodies with nuclear particles.

There are many situations where it has been desired to form an irradiated region of a precise thickness, dosage and dosage gradient in a material with nuclear particles of molecular weight of at least one (1). This has not, however, been generally possible in the past without great difficulty.

Nuclear particles of molecular weight of at least one (1) cause localized damage in materials on irradiation. The irradiation damage or defect generation by such nuclear radiation is concentrated in a relatively narrow region near the end of the particle penetration into the material. The irradiated regions thus formed have been dependent upon the energy and energy distribution of the available radiation sources. Most such radiation sources are essentially monoenergetic beams produced by Van de Graaff accelerators. Irradiated regions produced by such monoenergetic sources are gaussian shaped with a very narrow half-width. Thus, if an irradiated region from nuclear radiation with a molecular weight of at least one (1) was needed in a material, the material would have to be irradiated successively with radiation sources of different energies and different dosages. This procedure was time consuming and in many instances impossible.

The thickness of such irradiated regions has been extended without successive irradiations by pivotally moving the material in an oscillatory manner, but even with this technique, the thickness of the irradiated region was typically less than 5 um. Scattering foils have been placed between the beam generator and irradiated material, but these foils were necessarily of uniform thickness to provide the desired scattering of the beam and substantially uniform dosage over a large area of the material. It was not proposed to shape a material of low scattering properties to modify and modulate the beam energy to tailor an irradiated region of desired thickness, dosage and dosage gradient.

The present invention particularly provides an improvement on the invention claimed in U.S. Pat. No. 4,056,408, as well as the other inventions claimed in applications and patents referenced there, all of which are assigned to the assignee of the present application. The invention claimed in U.S. Pat. No. 4,056,408 involves reducing the switching time of semiconductor devices by precisely locating an irradiated region formed by nuclear irradiation in the device adjacent a blocking PN junction of the device. Although the invention there described has particular value, its applications and benefits have been limited by the energies and energy distributions of available radiation sources.

The present invention has particular application in making semiconductor devices having one or more blocking PN junctions in their structure. Such semiconductor devices include thyristors, transistors, diodes, diacs, triacs, reverse switching rectifiers and reverse conducting thyristors among others. Such semiconductor devices are required in their operation to change from a high conduction mode to a low conduction, high blocking mode rapidly. This change, which has typically been defined as switching time or reverse recovery time or reverse recovery charge has been limited to the diffusion and recombination lifetimes of the carriers in the device. In turn, the applications of such devices, and particulalry high power devices, have been correspondingly limited.

As explaind in U.S. Pat. No. 4,056,408, applicant and his colleagues have sought to decrease the swtiching time and reverse recovery time of semiconductor devices by various irradiation methods. These have involved, however, to one degree or another a trade-off with other electrical characteristics and most notably forward voltage drop of the semiconductor device. That is, if a very low turn-off time or reverse recovery time is desired, a higher forward voltage drop had to be tolerated in the device. The same is true if a low reverse recovery charge is desired.

The present invention substantially reduces the impact of this trade-off in tailoring the electrical characteristics of semiconductor devices by irradiation. More broadly, the invention also provides a means for precision forming of irradiated regions in semiconductor bodies and materials generally with accurate control over the thickness of the irradiated region, and its dosage and dosage gradient. The present invention also permits forming an accurately dimensioned and dosage contoured irradiated region internally of a material a desired distance from the selected surface of the material.

SUMMARY OF THE INVENTION

The present invention provides a method of forming an irradiated region of a desired thickness, dosage and dosage gradient in a material such as semiconductor body a desired distance from a selected surface thereof. The invention is particularly useful in tailoring irradiated regions to simulate radiation effects on material properties produced by fast neutrons of a fusion reaction, and in forming irradiated regions changing the electrical characteristics of semiconductor bodies without affecting other electrical characteristics of the body.

The method is commenced by providing a radiation beam from a given radiation source radiating particles with molecular weight of at least one (1) capable of penetrating a material wherein an irradiated region is to be formed though a selected surface to greater than the maximum desired distance of the irradiated region from the selected surface. Preferably, such nuclear radiation source is protons or alpha particles produced by a Van de Graaff accelerator forming a substantially monoenergetic radiation beam. Such radiation sources can be produced relatively inexpensively, and are substantially chemically and electrically inactive on irradiation into the material.

A beam modifier of a given material and nonuniform shape is formed to modify the energy of the radiation beam on transmission therethrough. Preferably the beam modifier is made of material such as aluminum to reduce scattering and provide good resolution for a transmitted radiation beam. The beam modifier is of a shape to form a transmitted radiation beam capable of forming an irradiated region of a desired thickness and dosage gradient in the material a given distance from the selected surface on irradiation of the material through the selected surface with the transmitted radiation beam. Almost any reasonable distance between the irradiated region and selected surface and any reasonable thickness of the irradiated region is possible provided the radiation source emits particles of energy sufficient to penetrate to the maximum depth of the irradiated region from the selected surface. Also, any desired dosage gradient can be provided by proper design of the beam modifier and control of the relative motion between the modifier and material during the irradiation.

The irradiated region is formed by positioning the selected surface of the material to be exposed to the radiation beam through the beam modifier. The beam transmitted through the beam modifier thus irradiates the material through the selected surface and forms the desired irradiated region within the material. The thickness of the irradiated region, i.e., its linear dimension along the path of the radiation beam, and its distance from the selected surface are accurately controlled by the energy of the radiation source and varied thickness of the beam modifier. The dosage is controlled with precision by the contour of the beam modifier and the predetermined relative movement between the beam modifier and material during the irradiation.

The present invention is particularly useful in preparing semiconductor devices where certain electrical characteristics of the device are changed while others remain substantially unaffected. More particularly, the invention provides thyristors, diodes and other semiconductor devices containing one or more blocking PN junction with certain electrical characteristics dramatically changed without substantially effecting other electrical characteristics of the device. Preferably, the irradiated region is formed at least adjacent at least one PN junction in the semiconductor to provide the desired electrical characteristics as more fully explained hereinafter.

Other details, objects and advantages of the invention will become apparent as the following description of the presently preferred embodiments and presently preferred methods of practicing the same proceeds.

BRIEF DESCRIPTION OF THE DRAWINGS

In the accompanying drawings, the presently preferred embodiments of the invention and presently preferred methods of practicing the invention are illustrated in which.

DESCRIPTION OF THE PREFERRED EMBODIMENTS

Figure 1:
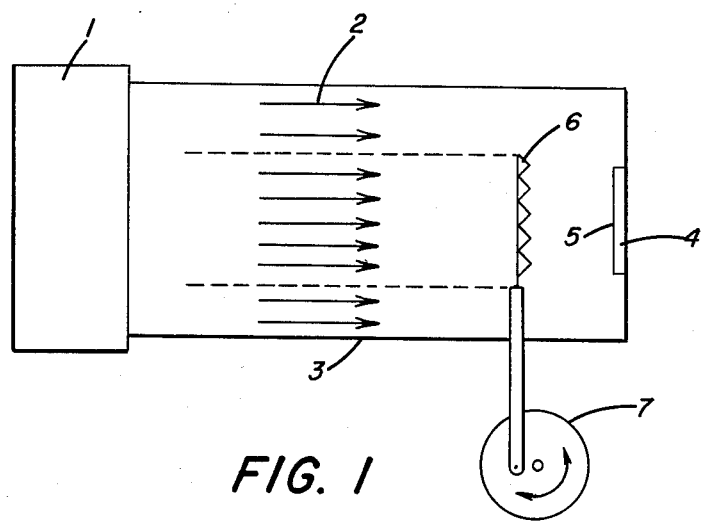
FIG. 1 is a schematic showing the general operation of the present invention.

Referring to FIG. 1, general arrangement is shown schematically for performance of the present invention. A radiation source 1 is provided which is capable of irradiating particles with molecular weight of at least one (1) to form radiation beam 2 in beam tube 3. Radiation beam 2 is of an energy capable of penetrating material 4 positioned at the end of beam tube 3 through selected surface 5 to a depth greater than the maximum depth of the irradiated region desired in the material.

Radiation source 1 may be any conveniently available source which emits nuclear particles of molecular weight of at least one (1) which has sufficient energy to penetrate material 4 to at least the desired depth of the irradiated region. Preferably the radiation source is a Van de Graaff accelerator emitting protons or alpha particles because such particles are relatively inexpensive to accelerate to energy sufficient to penetrate the material to the desired depth. Also such radiation sources are readily available. Other nuclear particles having a molecular weight of at least one (1) may be utilized; however, nuclear particles having a molecular weight higher than 16 are presently impractical because available radiation sources, e.g., Van de Graaff accelerators, do not generate high enough energy to cause penetration of such higher molecular weight particles into material to a significant depth. The radiation source is also preferably a monoenergetic source such as conventionally produced by Van de Graaff accelerators to permit the irradiated region to be more precisely controlled in thickness, width and dosage gradient. For this reason, higher molecular particles such as nitrogen ions may be more useful in certain applications where higher resolution is desired for the irradiated region because such ions have a narrower half-width to the defect generation distribution produced in materials. Also, where the material 4 is a semiconductor body, it is preferred to use radiation sources emitting particles such as protons, alpha particles and nitrogen ions which are essentially chhemically and electrically inactive on irradiation into the material.

Additionally, it should be observed that it may be appropriate in certain applications to use a nonmonoenergetic radiation source or to modify a monoenergetic source so that it is not monoenergetic. For example, it may be more desirable to have a more uniform particle distribution over the area of the material 4 at a sacrifice of resolution of the depth of the irradiated region. This can be done by utilization of a scattering foil (not shown) in the path of the radiation beam 2 between the radiation source 1 and the material 4. Generally, however, a monoenergetic radiation source is preferred to provide the narrowest half-width for the defect generation distribution of the beam in the material and in turn the highest possible resolution for the irradiated region formed in the material.

Positioned between the radiation source 1 and material 4 in the path of radiation beam 2 is a beam modifier 6. Beam modifier 6 is selected of a material to allow transmission of radiation beam 2 through it normally without substantially scattering of the beam. Although in some circumstances it may be appropriate to incorporate a scattering foil with beam modifier 6, typically it is desired that the transmitted energy beam not be dispersed due to variations in the thickness of the modifier as hereafter described. This improves the accuracy of the resolution of the irradiated region as described further hereafter. Beam modifier 6 is of a material which modifies the energy of the transmitted beam, but is preferably selected from a material which does not modify the energy of the beam greatly per unit thickness. This permits the accuracy of the thickness and dosage gradient of the irradiation region to be more precisely controlled without critically controlling dimensional tolerances of the beam modifier. Examples of such materials are those composed of low atomic number elements such as aluminum. Also, the beam modifier is preferably made of a material that is easily worked to the desired shape as hereinafter explained.

Preferably the material 4 and beam modifier 6 are moved relative to each other through a predetermined motion during the irradiation. This can be done by any suitable means. As shown in FIG. 1, the beam modifier 6 is attached eccentrically to a rotating wheel 7, rotated by an electric motor. The beam modifier is thus oscillated normal to the path of radiation beam 2 parallel to the selected surface 5 of material 4. Alternatively, the beam modifier could be rotated or otherwise moved relative to material 4, or material 4 can be moved relative to the beam modifier 6.

Given the radiation source 1 and the material of the beam modifier 6, the thickness and dosage gradient of the irradiated region to be formed in material 4 becomes a function of the shape of the beam modifier 6 and the relative motion between the material 4 and beam modifier 6 during the irradiation. Typically the relative movement between the beam modifier and the material is a constant so that the thickness and dossage gradient of the irradiated region becomes a function solely of the shape of the beam modifier.

Figure 3:
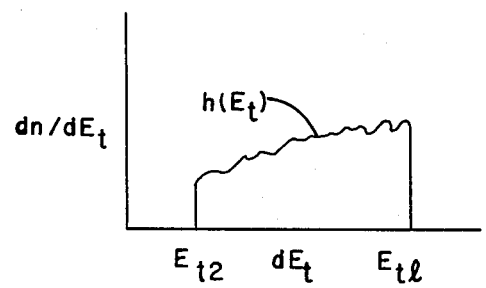
FIG. 3 is a graph showing the energy distribution of a radiation beam transmitted through a beam modifier and corresponding to desired irradiated region in a material.
Figure 4:
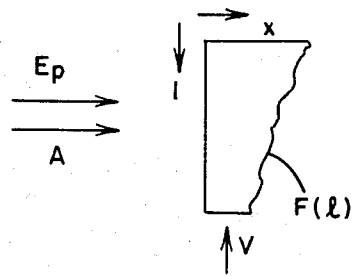
FIG. 4 is an elevational view of a beam modifier producing the energy distribution shown in FIG. 3 on transmission of a monoenergetic radiation beam.

One can therefore shape the beam modifier to correspond to any desired thickness and dosage gradient of the irradiated region material 4 and any desired distance between selected surface 5 and the irradiated region of the material 5. To understand the relation, consider that the energy spectrum of the beam after transmission through the beam modifier corresponding to the desired positioning, thickness and dosage gradient of the irradiated region within material 4 is represented by the materially function $dn(E_t)/dE_t = h(E_t)$ as shown in FIG. 3. Further, consider that the beam modifier shape corresponding to this energy spectrum is shown in FIG. 4 and represented by the mathematical $F(l) = X$. Also consider that l is a mathematical function of X, $F(X)$.

Now consider the energy of the transmitted radiation beam at point A in FIG. 4. The beam directed at this point must pass through a thickness $X_l$ of the beam modifier which will reduce the energy of the beam from $E_p$ to $E_l$. The flux density at Point A is $\phi$ in particles per second, stated mathematical as $\phi = dn/dt$. Since the beam modifier moves vertically as shown in FIG. 1 with a speed $V = d/dt$, the number of particles which strike point A in a time dt is defined as $dn = \phi dt - \phi/V \cdot dl$. Since $l = f(x)$ and $dl = df(x)/dx \cdot dx$, $dn = \phi/V \cdot df(x)/dx \cdot dx$.

The variable x is the thickness of the beam modifier through which the beam passes to A at any moment in time and is functionally related to the energy of the particles emerging from the beam modifier. Suppose that R (the range of the particles) and E (the energy of the particles) are related by the mathematical function $R = g(E)$. The range of the incoming particles to the beam modifier is $Rp = g(E_p)$, and the range of the exiting particles from the beam modifier is $R = g(E)$. The thickness of the beam modifier can be expressed as a mathematical function of the energy as follows:

$$x = Rp - R = g(E_p) - g(E).$$

Substituting this x in the preceding equation the particles reaching point A can be stated as:

$$dn = \frac{\phi}{V} \cdot \frac{df(g(E_p) - g(E))}{dg(E)} \cdot \frac{dg(E)}{dE} \cdot dE$$

The thickness of the beam modifier can thus be expressed mathematically in terms of the transmitted energy spectrum as follows:

$$\frac{df(g(E_p) - g(E))}{dgE} = \frac{V}{\phi} \cdot \frac{dn}{dE} \cdot \left(\frac{dg(E)}{dE}\right)^{-1}$$

For complex energy spectra, dn/dE, the shape of the modifier can be calculated by computer. For more simple spectra the shape can be determined by simple hand calculation.

For example, consider $dn/dE = K$ (a constant) and $R = g(E) = E/m$, i.e., the range dependence on energy is linear with mass. The mathematically function reduces to:

$$\frac{df\left(\frac{E_p}{m} - \frac{E}{m}\right)}{d\left(\frac{E}{m}\right)} = \frac{VK}{\phi} \frac{dE}{d\left(\frac{E}{m}\right)}$$

Substituting $x = Ep/m - E/m$, the function further reduces to:

$$\frac{df(x)}{dx} = \frac{VK}{\phi}$$

The general solution to this equation is:

$$f(x) = \frac{VK}{\phi} mx + b = 1$$

Stated another way for $x = F(l)$:

$$x = \frac{-\phi}{VKm} + \frac{b\phi}{VKm}$$

The constant b can be obtained by letting x be the thickness X (at l=0) for the lowest energy in the spectrum:

$$b = X_l \frac{VKm}{\phi}$$

The length of the beam modifier, L, depends on $X_2$, which is the thickness for $E_2$. The beam modifier can thus be shaped as shown in FIG. 5 with a slope $\phi/VKm$.

Figure 2:
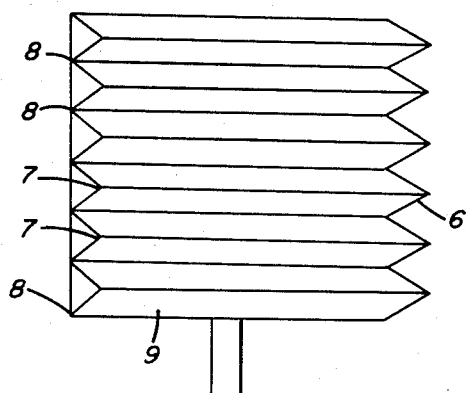
FIG. 2 is an enlarged view in perspective of the beam modifier shown in FIG. 1.
Figure 5:
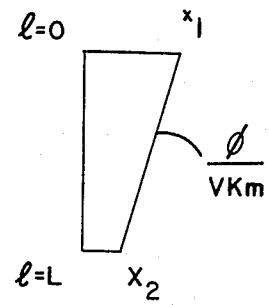
FIG. 5 is an elevational view of a beam modifier appropriate to form a rectangular irradiated region of substantially uniform dosage.

From this, it can be seen that beam modifier for a rectangular irradiated region can be shaped as shown in FIG. 5. However, a large number of cycles of the energy spectrum is desirable to eliminate spectrum distortions produced by small temporal fluctuations in the energy and density of the beam emitted from the radiation source. The beam modifier should, therefore, more properly take on the form of a sawtooth pattern as shown in FIGS. 1 and 2, where $X_1$ corresponds to the largest thickness at points 8, $X_2$ corresponds to the smallest thickness at points 9, and $\phi/VKm$ is the slope of surfaces 10.

Figure 6:
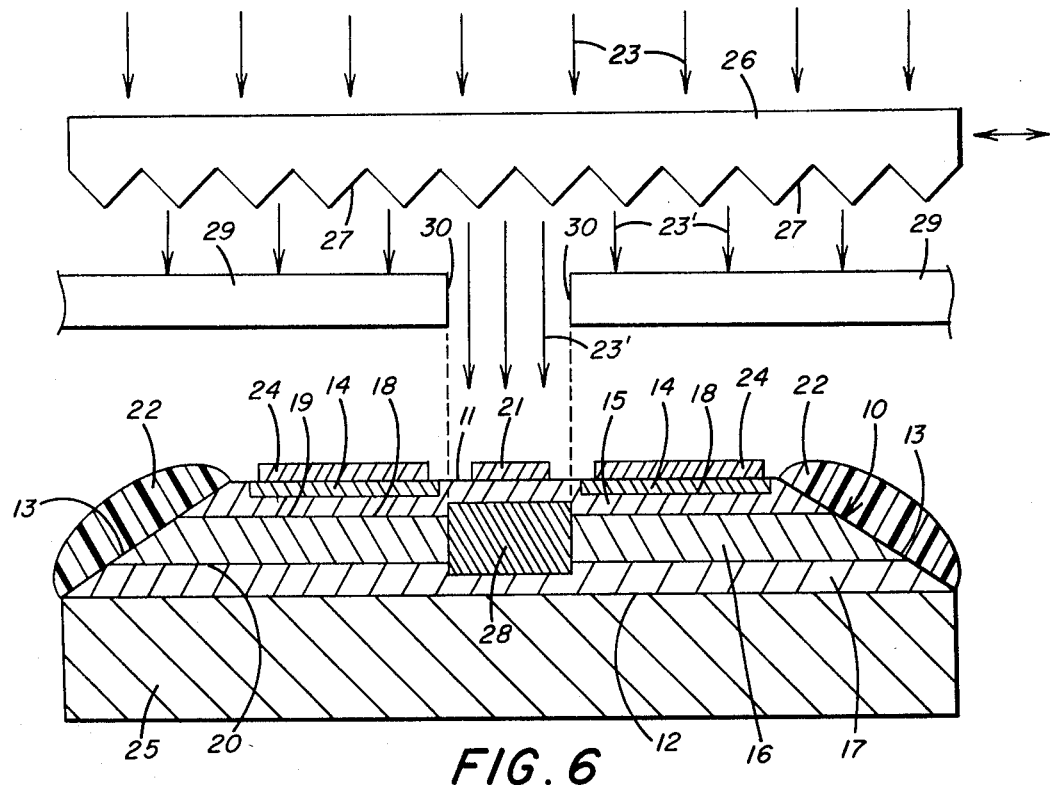
FIG. 6 is an elevational view in cross-section of a center fired thyristor made in accordance with the present invention.

Referring to FIG. 6, a center fired silicon thyristor wafer or body 10 is shown having opposed major surfaces 11 and 12 and curvilinear side surfaces 13. The thyristor wafer 10 has cathode-emitter region 14 and anode-emitter region 17 of impurities of opposite conductivity type adjoining major surfaces 11 and 12, respectively, and cathode-base region 15 and anode-base region 16 of impurities of opposite conductivity type in the interior of the wafer 10 between emitter regions 14 and 17. Cathode emitter region 14 and cathode-base region 15 are also of opposite conductivity type of impurities as is anode-base region 16 and anode-emitter region 17. By this arrangement, thyristor wafer 10 is provided with a four layer impurity structure in which three PN junctions 18, 19 and 20 are provided between adjoining regions.

The thyristor is provided with a center fired gate by adjoining cathode-base region 15 to the major surface 11 at center portions thereof. Cathode-emitter region 14 thus extends around surface portions of region 15. To provide electrical connection to the thyristor wafer, metal contacts 21 and 24 make ohmic contact to cathode-base region 15 and cathode-emitter region 14, respectively, at major surface 11; and metal substrate 25 makes ohmic contact to anode-emitter region 17 at major surface 12. Atmospheric effects on the thyristor operation are substantially reduced by coating side surfaces 13 with a suitable passivating resin 22 such as silicone or epoxy composition.

Major surface 11 is selected as the reference surface from which the irradiated region 28 is to be a desired distance. Major surface is also the selected surface to be exposed to radiation beam 23 from a given radiation source radiating particles with a molecular weight greater than one (1). Although essential, and in embodiments it may be different, generally major surface 11 is positioned to be at substantially right angles to radiation beam 23 so that irradiated region 28 is a substantially uniform distance from major surface 11.

Beam modifier 26 is positioned between the radiation source and major surface 11 so that the thyristor irradiated with a beam is transmitted through modifier 26. Modifier 26 is selected of a material which does not scatter the radiation beam substantially and which has a density such that it does not reduce the energy of the particle beam greatly for a given unit as the beam moves through the material. By selection of such material, modifier 26 can be made to accurately contour the energy of the radiation beam to the desired energies for formation of irradiation region 28. The material for modifier 26 is also selected of a material such as aluminum which is easily worked by machining or other means. Modifier 26 is shaped in a sawtooth pattern 27 as more generally described in connection with FIGS. 1 through 5. Modifier 26 is also preferably moved parallel to major surface 11 through a predetermined motion during irradiation corresponding with a desired dosage gradient or irradiated region 28. Typically, the motion of modifier 26 is relatively constant and reciprocal so that the dosage gradient is controlled by the shape of the beam modifier.

The sawteeth of beam modifier 26 are selected of such depth and slope to control the width and dosage gradient of irradiated region 28.

Also positioned between the thyristor and the radiation source is a mask 29 which is capable of stopping radiation beam 23 and shielding conducting portions 31 of the thyristor from being irradiated. Irradiated region 28 is thus selectively formed in gating portions of the thyristor of a desired thickness and dosage gradient a desired distance from major surface 11 by irradiation through opening 30 in mask 29.

Irradiated region 28 extends across PN junctions 19 and 20 through anode-base region 16 into cathode-base region 15 and anode emitter region 17. This causes the thyristor to have substantially reduced reverse recovery time ($t_{rr}$), reverse recovery charge ($Q_{rr}$) and reverse recovery current ($I_{rr}$). Although other electrical characteristics such as forward voltage drop is not substantially effected by irradiated region 28, certain parameters such as leakage current may be significantly effected.

Figure 7:
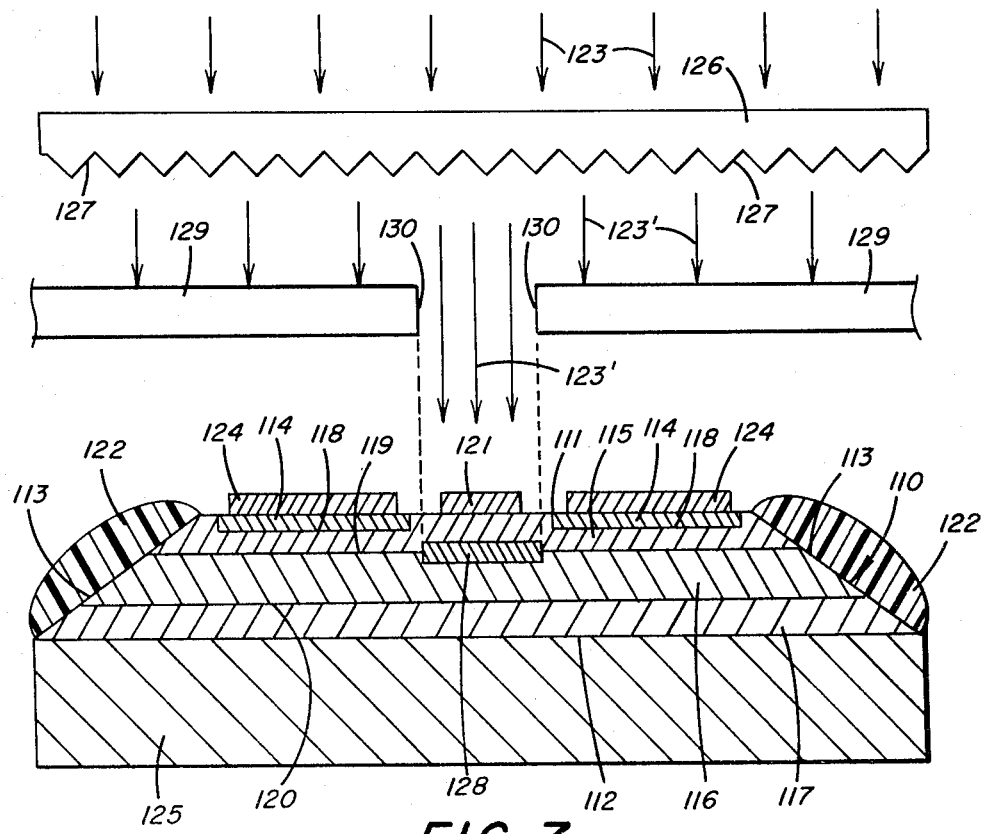
FIG. 7 is an elevational view of a second center fired thyristor made in accordance with the present invention.

Referring to FIG. 7, a second center fired thyristor is shown with the same arrangement for irradiation as described in FIG. 6. The same parts have been numbered with the prefixed "1" before them to identify the corresponding parts. The only change is in the thickness dosage and dosage gradient of the irradiated region 128, and the corresponding thickness of beam modifier 126 and the depth and slope of the sawteeth 127 of modifier 126. The thickness of beam modifier 126 and the depth and slope of sawteeth 127 are selected so that the irradiated region 128 is only in cathode-base region 115 and anode-base region 116 adjacent center PN junction 119. This irradiated region substantially reduces the reverse recovery time of the thyristor while leaving other parameters such as forward voltage drop and reverse recovery charge substantially unchanged. In addition, this embodiment provides a thyristor with reduced leakage current from the thyristor irradiated as shown in FIG. 6.

Figure 8:
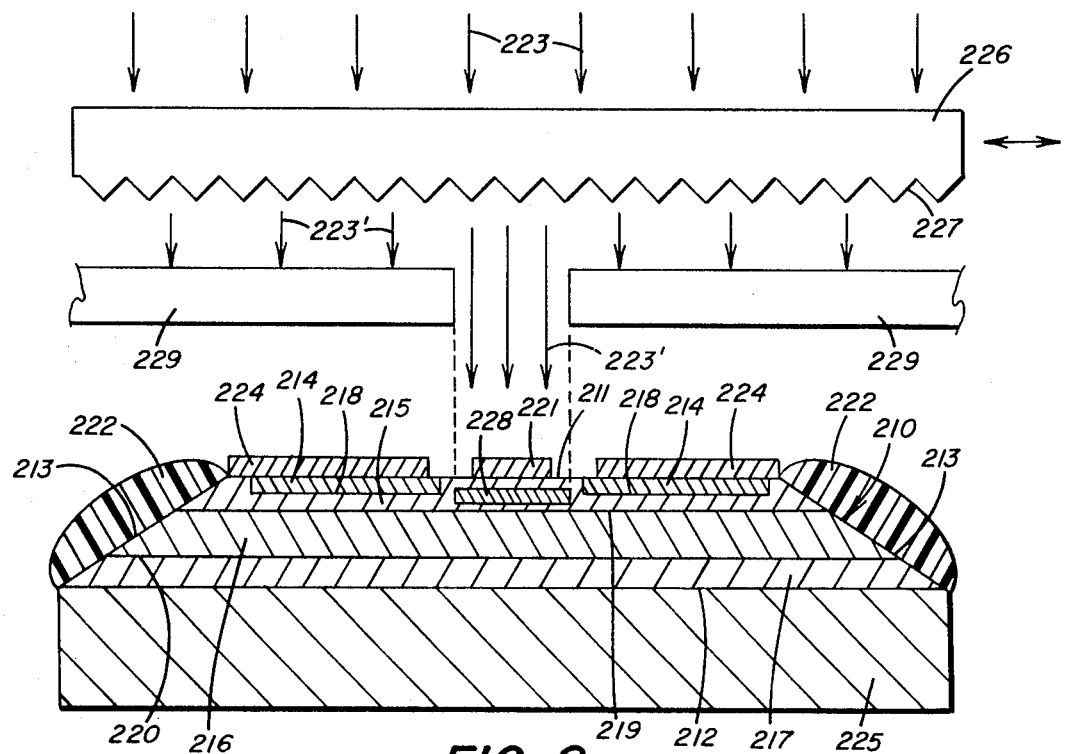
FIG. 8 is an elevational view in cross-section of a third center fired thyristor made in accordance with the present invention.

Referring to FIG. 8, a third center fired thyristor is shown irradiated again as shown and described in FIG. 6. Corresponding parts have been identified with the prefix "2" for easy reference. Again, only irradiated region 228 and correspondingly the thickness of beam modifier 226 and the slope and depth of sawteeth 227 have been changed. In this embodiment the thickness of beam modifier 226 and the slope and depth of sawteeth 227 are selected so that irradiated region is only in cathode-base region 215 adjacent to center PN junction 219 and adjacent the depletion region formed at that PN junction. This embodiment reduces the reverse recovery time of the thyristor without any appreciable increase in leakage current.

Figure 9:
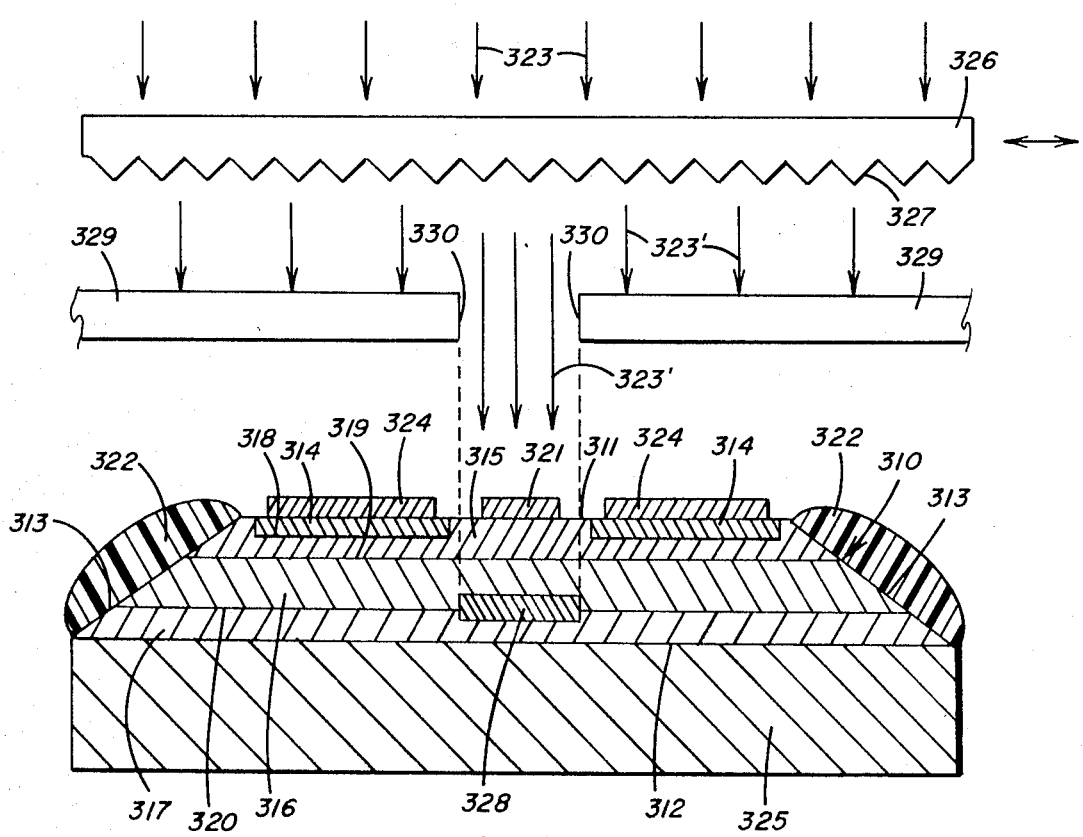
FIG. 9 is an elevational view in cross-section of a fourth center fired thyristor made in accordance with the present invention.

Referring to FIG. 9, a fourth center fired thyristor is shown irradiated as described in connection with FIG. 6. Corresponding parts have been identified with the prefix "3". Again, the only change is in the thickness dosage and dosage gradient of irradiated region 328 and its location from selected surface 311, and the corresponding changes in thickness of beam modifier 326 and the depth and slope of the sawteeth 327. The beam modifier 326 and the slope and thickness and depth of the sawteeth 327 are selected so that the irradiated region 328 is in the anode-base and anode-emitter regions 316 and 317 at anode PN junction 320. This embodiment particularly lowers the reverse recovery charge of the thyristor, as well as to a lesser degree the reverse recovery time and the reverse recovery current. The resulting thyristor does, however, have an increased leakage current from the same device prior to irradiation.

Figure 10:
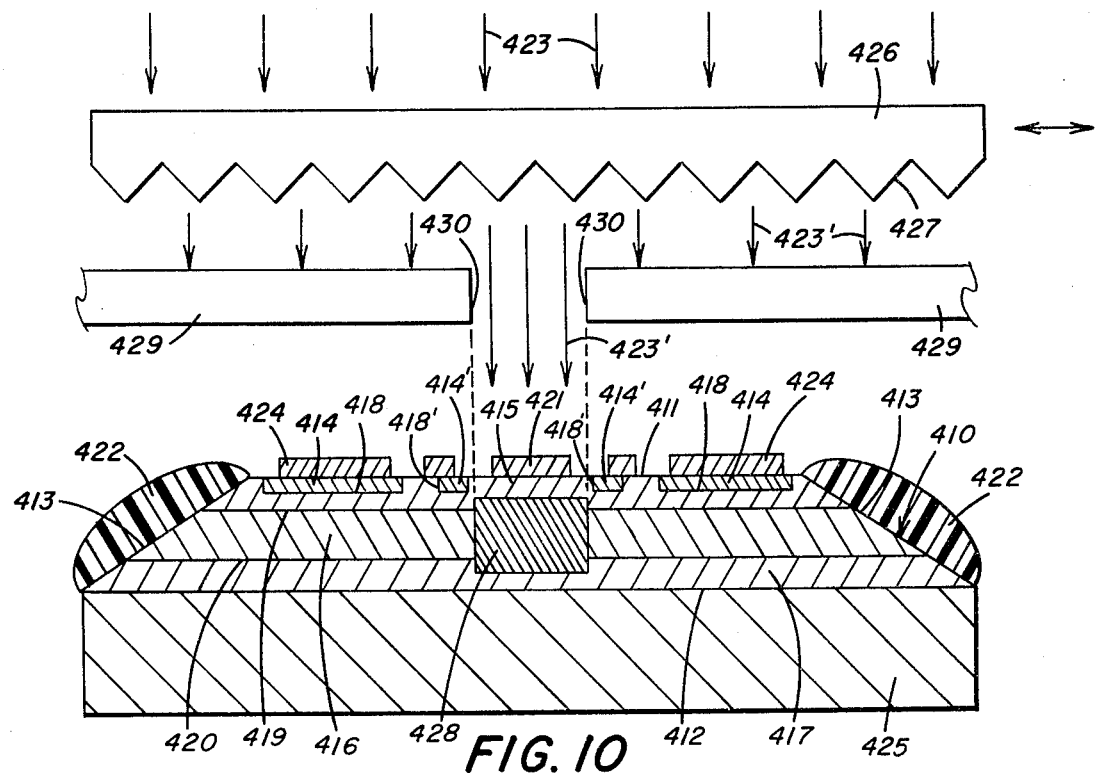
FIG. 10 is an elevational view in cross-section of an amplifying gate thyristor made in accordance with the present invention.

Referring to FIG. 10, an amplifying gate thyristor is shown of essentially the same arrangement as the center fired thyristor shown in FIG. 6, and irradiated in the same way as the thyristor shown and described in connection with FIG. 6. Corresponding parts have been identified with the prefix "4" for ready identification. The only change is that the thyristor has an auxiliary cathode-emitter region 414' and floating electrode 421' adjacent the cathode-emitter 414 to provide a pilot thyristor which can readily turn on the main thyristor with a small gate signal. Irradiated region 428 is shown essentially the same as the irradiated region 28 shown in FIG. 6, and has essentially the same effect on the electrical characteristics of the thyristor. It should be noted that the irradiated region 428 is only in the gating portion of the thyristor adjacent to the cathode-emitter region 414' and not in the gating portion between the cathode-emitter region 414' and the cathode-emitter region 414. The reason for this is that in a well designed thyristor, there is not sufficient room between the pilot and main devices to provide for formation of an irradiated region. It should be noted, however, that if there is room because of an interdigitated design, such as the snowflake design, that the irradiated region should be formed between the auxiliary cathode-emitter 414' and the main cathode emitter 414 extending from the cathode base 415 through the anode base 416 and into the anode-emitter region 417, while leaving the regions under cathode-emitter region 414' unchanged. It should be observed that this will require changing the mask 429 to permit formation of the irradiated region 428 into non-contiguous areas of the device.

Figure 11:
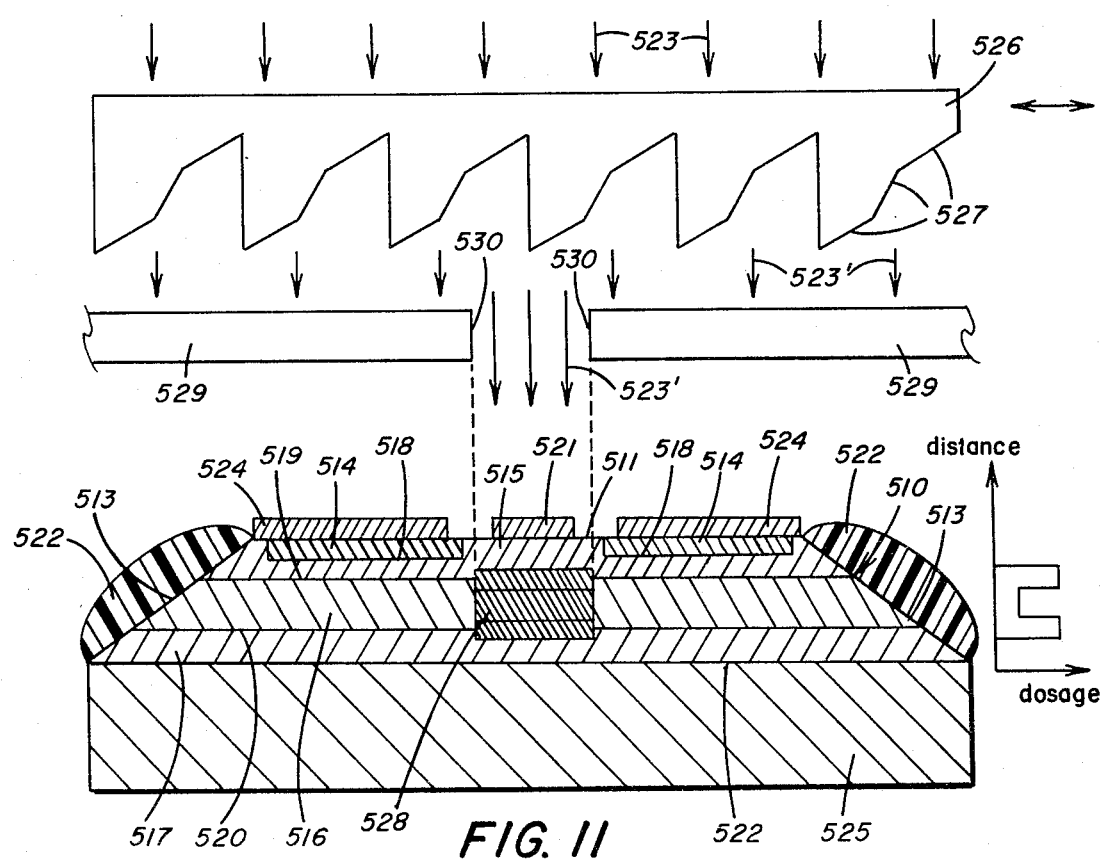
FIG. 11 is an elevational view in cross-section of a fifth center fired thyristor made in accordance with the present invention.

Referring to FIG. 11, a center fired thyristor as described in FIG. 6 is irradiated substantially the same as shown in FIG. 6. Corresponding parts have been identified with the prefix "5" for easy reference. The difference is in the thickness dosage and dosage gradient of the irradiated region 528 and the correspondingly thickness of the beam modifier 526 and the depth and slope of the surface or sawteeth 527 of beam modifier 526. The surface 527 beam modifier 526 is provided with three separate slopes to provide the irradiated region 528 as shown. A small graph as shown to the right of the thyristor qualitatively showing the dosage gradient of irradiated region 528. As shown the irradiated region extends from the cathode-base region 515 through the anode-base region 516 and into anode-emitter region 517. The dosage gradient is selected so that the highest extent of radiation is adjacent the PN junctions 519 and 520. This embodiment provides fast reverse recovery time and low reverse recovery charge and reverse recovery current. It should be noted, however, that the leakage current of this device is increased by the irradiation.

Figure 12:
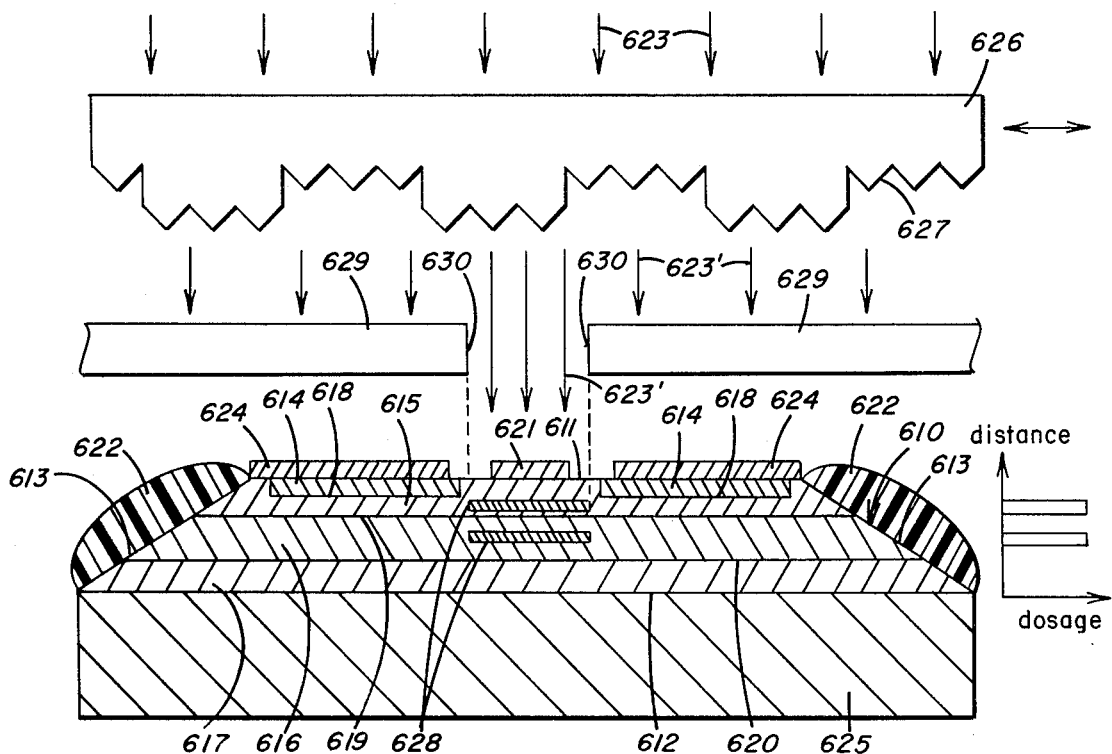
FIG. 12 is an elevational view in cross-section of a sixth center fired thyristor made in accordance with the present invention.

Referring to FIG. 12, another center fired thyristor as described in FIG. 6 is irradiated substantially as described in connection with FIG. 6. Corresponding parts are identified with the prefix "6" to readily identify them. The change is that the irradiated region 628 is effectively split into two irradiated regions, one in the cathode-base region 615 and the other in the anode-base region 616 adjacent PN junctions 619 and 620 respectively and outside the depletion regions formed by those PN junctions. Beam modifier 626 is correspondingly shaped with a step function shape and the sawtooth 627 formed on both surfaces of the step function. The sawtooth shape on each of the surfaces may vary in depth and slope to correspond to the desired thickness and dosage gradient of the respective parts of irradiated region 628. The quantitative shape of the dosage gradient of irradiated region 628 is shown by the small graph to the right of the thyristor in FIG. 12.

Figure 13:
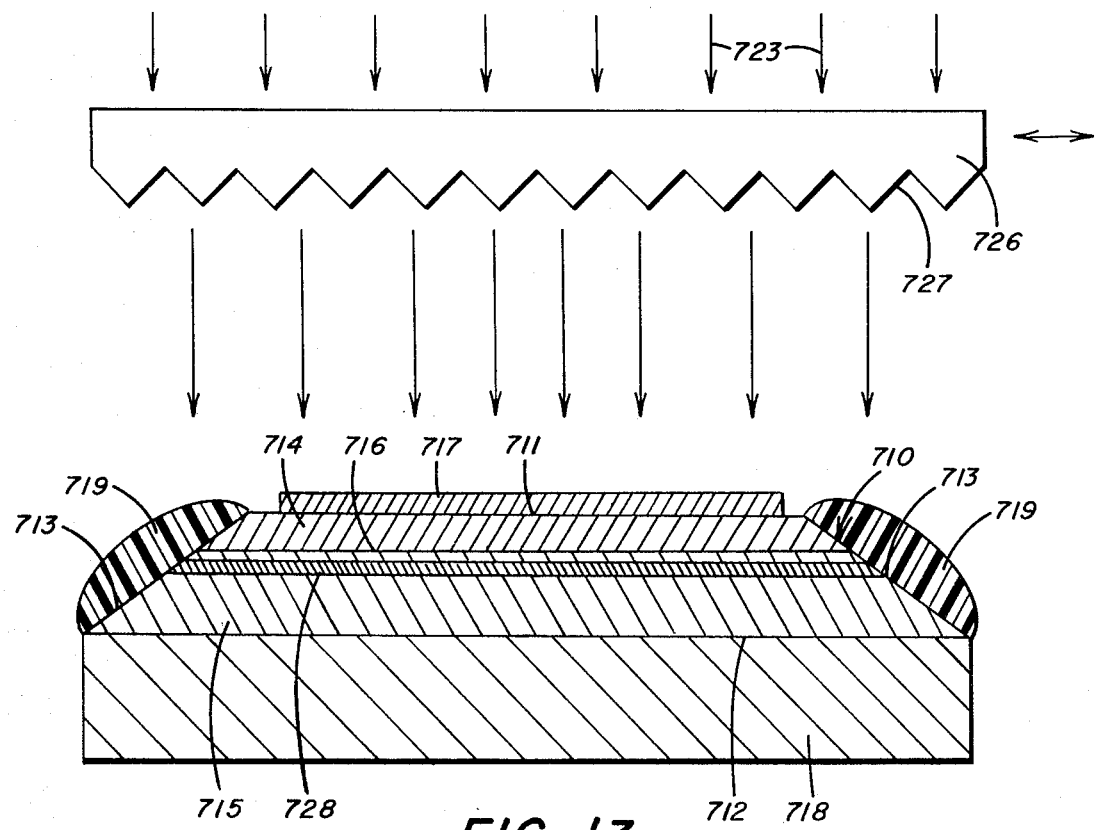
FIG. 13 is an elevational view in cross-section of a diode made in accordance with the present invention.

Referring to FIG. 13, a power diode body 710 is shown having opposed major surfaces 711 and 712 and curvilinear side surfaces 713. The cathode wafer 710 has cathode-base region 714 and anode-base region 715 of impurities of opposite conductivity type adjoining major surfaces 711 and 712 respectively and adjoining each other to form PN junction 716.

The diode has metal contact 717 making only contact to cathode-base region 714 at major surface 711, and metal substrate 718 making ohmic contact to anode-base region 715 and major surface 712. Atmospheric effects on the diode operation are substantially reduced by coating side surfaces 713 with a suitable passivating resin such as silicone or epoxy composition.

The diode is irradiated as described in connection with FIG. 6. For easy reference the prefix "7" has been added to the numbers. The thickness of beam modifier 726 and the depth and slope of sawteeth surface 727 and beam modifier 726 are selected to provide the irradiated region 728 in anode-base region 715 adjacent the PN junction 716 outside the depletion region formed as that junction. No mesh corresponding to mask 29 is provided to shield parts of the device so that the irradiated region 728 extends across the entire device. The diode thus formed has a substantially reduced reverse recovery charge without effecting the leakage current of the device.

While presently preferred embodiments have been shown and described, it is distinctly understood that the invention may otherwise be variously performed and embodied within the scope of the following claims.

What is claimed is:

1. A method of forming an irradiated region of a desired thickness, dosage and dosage gradient in a material a desired distance from a selected surface thereof comprising the steps of:
   A. providing a radiation beam from a given radiation source radiating particles with molecular weight of at least one (1) capable of penetrating a material wherein an irradiated region is to be formed through a selected surface to greater than a maximum desired depth of the irradiated region from the selected surface;
   B. modifying the beam with a beam modifier of a given material and non-uniform shape to modify the energy of said radiation beam on transmission therethrough to form a transmitted radiation beam capable of forming an irradiated region of a desired thickness and dosage gradient in the material a given distance from the selected surface on irradiation of the material through the selected surface with the transmitted radiation beam;
   C. positioning the material with said selected surface thereof to be exposed to the radiation beam from the radiation source on transmission through the beam modifier modifying the energy of the beam; and
   D. thereafter irradiating the material through the beam modifier and through the selected surface to form in the material an irradiation region of desired thickness, dosage and dosage gradient a desired distance from the selected surface.

2. A method of forming an irradiated region of a desired thickness, dosage and dosage gradient in a material a desired distance from a selected surface thereof as set forth in claim 1 wherein:
   in step A, the radiation source is selected from the group consisting of proton and alpha particle sources.

3. A method of forming an irradiated region of a desired thickness, dosage and dosage gradient in a material a desired distance from a selected surface thereof as set forth in claim 1 wherein:
   in step A, the radiation source is a substantially monoenergetic source.

4. A method of forming an irradiated region of a desired thickness, dosage and dosage gradient in a material a desired distance from a selected surface thereof as set forth in claim 3 wherein:
   in step A, the radiation source is selected from the group consisting of proton and alpha particle sources.

5. A method of forming an irradiated region of a desired thickness, dosage and dosage gradient in a material a desired distance from a selected surface thereof as set forth in claim 1 comprising in addition:
   E. moving the beam modifier and the material relative to each other through a predetermined motion during the irradiation step.

6. A method of changing the electrical characteristics of a semiconductor body comprising the steps of:
   A. providing a radiation beam from a given radiation source radiating particles with molecular weight of at least one (1) capable of penetrating a semiconductor body wherein an irradiated region is to be formed through a selected surface to greater than a maximum desired depth of the irradiated region;
   B. modifying the beam with a beam modifier of a given material and non-uniform shape to modify the energy of said radiation beam on transmission therethrough to form a transmitted radiation beam capable of forming an irradiated region of a desired thickness and dosage gradient in the semiconductor body a given distance from the selected surface on irradiation of the semiconductor body through the selected surface with the transmitted radiation beam;
   C. positioning the semiconductor body with said selected surface thereof to be exposed to the radiation beam from the radiation source on transmission through the beam modifier modifying the energy of the beam; and
   D. thereafter irradiating the semiconductor body through the beam modifier and through the selected surface to form in the semiconductor body an irradiated region of desired thickness, dosage and dosage gradient a desired distance from the selected surface.

7. A method of changing the electrical characteristics of a semiconductor body as set forth in claim 6 comprising in addition:
   E. moving the beam modifier and the semiconductor body relative to each other through a predetermined motion during the irradiation step.

8. A method of changing the electrical characteristics of a semiconductor body as set forth in claim 7 wherein:
   in step A, the radiation source is selected from the group consisting of proton and alpha particle sources.

9. A method of changing the electrical characteristics of a semiconductor body as set forth in claim 7 wherein:
   in step A, the radiation source is a substantially monoenergetic source.

10. A method of changing the electrical characteristics of a semiconductor body as set forth in claim 9 wherein:
    in step A, the radiation source is selected from the group consisting of proton and alpha particle sources.

11. A method of changing the electric characteristics of a semiconductor body as set forth in claim 6 comprising in addition:
    E. masking selected portions of the semiconductor body against irradiation from said radiation source during step D.

12. A method of changing the electrical characteristics of a semiconductor body as set forth in claim 11 wherein:
   in step A, the radiation source is selected from the group consisting of proton and alpha particle sources.

13. A method of changing the electrical characteristics of a semiconductor device as set forth in claim 11 wherein:
   in step A, the radiation source is a substantially monoenergetic source.

14. A method of changing the electrical characteristics of a semiconductor body as set forth in claim 13 wherein:
   in step A, the radiation source is selected from the group consisting of proton and alpha particle sources.

15. A method of changing the electrical characteristics of a semiconductor body as set forth in claim 6 comprising in addition:
   F. annealing the semiconductor device to reduce sensitivity of electrical characteristics of the irradiated portion of the device to changes in operating temperature.

16. A method of changing the electrical characteristics of a semiconductor body as set forth in claim 15 wherein:
   in step A, the radiation source is selected from the group consisting of proton and alpha particle sources.

17. A method of changing the electrical characteristics of a semiconductor body as set forth in claim 15 wherein:
   in step A, the radiation source is a substantially monoenergetic source.

18. A method of changing the electrical characteristics of a semiconductor body as set forth in claim 17 wherein:
   in step A, the radiation source is selected from the group consisting of proton and alpha particle sources.

19. A method of changing the electrical characteristics of a semiconductor body as set forth in claim 15 comprising in addition:
   G. masking selected portions of the semiconductor body against irradiation from said radiation source during step D.

20. A method of changing the electrical characteristics of a semiconductor body as set forth in claim 19 wherein:
   in step A, the radiation source is selected from the group consisting of proton and alpha particle sources.

21. A method of changing the electrical characteristics of a semiconductor body as set forth in claim 19 wherein:
   in step A, the radiation source is a substantially monoenergetic source.

22. A method of changing the electrical characteristics of a semiconductor body as set forth in claim 21 wherein:
   in step A, the radiation source is selected from the group consisting of proton and alpha particle sources.

23. A method of changing the electrical characteristics of a thyristor comprising the steps of:
   A. providing a given radiation source radiating particles with molecular weight of at least one (1) capable of penetrating a thyristor wherein an irradiated region is to be formed through a selected surface to greater than a maximum desired depth of the irradiated region;
   B. forming a beam modifier of a given material and non-uniform shape to modify the energy of said radiation beam on transmission therethrough to form a transmitted radiation beam capable of forming an irradiated region of a desired thickness and dosage gradient in a gating portion of the thyristor a given distance from the selected surface on irradiation of the gating portion through a selected surface with the transmitted radiation beam;
   C. positioning the thyristor with said selected surface adjoining such gating portion thereof to be exposed to the radiation beam from the radiation source on transmission through the beam modifier modifying the energy of the beam;
   D. masking at least part of the conducting portions of the thyristor against irradiation from said radiation source; and
   E. thereafter irradiating the gating portions of the thyristor through the beam modifier and through the selected surface to form in the gating portion an irradiated region of desired thickness, dosage and gradient a desired distance from the selected surface.

24. A method of changing the electrical characteristics of a thyristor as set forth in claim 23 comprising in addition:
   F. moving the beam modifier and thyristor relative to each other through a predetermined motion during the irradiation step.

25. A method of changing the electrical characteristics of a thyristor as set forth in claim 24 wherein:
   in step A, the radiation source is selected from the group consisting of proton and alpha particle sources.

26. A method of changing the electrical characteristics of a thyristor as set forth in claim 24 wherein:
   in step A, the radiation source is a substantially monoenergetic source.

27. A method of changing the electrical characteristics of a thyristor as set forth in claim 26 wherein:
   in step A, the radiation source is selected from the group consisting of proton and alpha particle sources.

28. A method of changing the electrical characteristics of a thyristor as set forth in claim 23 wherein:
   the selected surface of thyristor through which irradiation is performed is adjacent a cathode-emitter region of the thyristor.

29. A method of changing the electrical characteristics of a thyristor as set forth in claim 23 wherein:
   in step E, the irradiated region formed in the gating portion of the thyristor is at least in part adjacent a PN junction between cathode-base and anode-base regions of the thyristor.

30. A method of changing the electrical characteristics of a thyristor as set forth in claim 23 wherein:
   in step E, the irradiated region in the gating portion adjacent a PN junction between anode-base and anode-emitter regions of the thyristor.

31. A semiconductor device having an irradiation region of given thickness, dosage and dosage gradient a given distance from a selected surface prepared by:
   A. providing a radiation beam from a given radiation source radiating particles with molecular weights of at least one (1) capable of penetrating the semiconductor device through the selected surface to a depth greater than a maximum desired depth of the irradiated region;

B. modifying the beam with a beam modifier of a given material and non-uniform shape to modify the energy of said radiation beam on transmission therethrough to form a transmitted radiation beam capable of forming an irradiated region of a desired thickness and dosage gradient in the semiconductor device the given distance from the selected surface on irradiation of the semiconductor device through a selected surface with the transmitted radiation beam;

C. positioning the semiconductor device with said selected surface thereof to be exposed to the radiation beam from the radiation source on transmission through the beam modifier modifying the energy of the beam; and D. thereafter irradiating the semiconductor device through the beam modifier and through the selected surface to form in the semiconductor device a nuclear irradiated region of defect generation having the desired thickness, dosage and dosage gradient the desired distance from the selected surface.

32. A semiconductor device having an irradiated region of given thickness, dosage and dosage gradient a given distance from a selected surface prepared according to claim 31 comprising in addition:
F. moving the beam modifier and the semiconductor device relative to each other through a predetermined motion during the irradiation step.

33. A semiconductor device having an irradiated region of given thickness, dosage and dosage gradient a given distance from a selected surface prepared according to claim 32 wherein:
in step A, the radiation source is selected from the group consisting of proton and alpha particle sources.

34. A semiconductor device having an irradiated region of given thickness, dosage and dosage gradient a given distance from a selected surface prepared according to claim 32 wherein:
in step A, the radiation source is a substantially monoenergetic source.

35. A semiconductor device having an irradiated region of given thickness, dosage and dosage gradient a given distance from a selected surface prepared according to claim 34 wherein:
in step A, the radiation source is selected from the group consisting of proton and alpha particle sources.

36. A semiconductor device having an irradiated region a given thickness, dosage and dosage gradient a given distance from a selected surface prepared according to claim 31 with the additional step of:
E. masking selected portions of the semiconductor device against irradiation from said radiation source during step D.

37. A semiconductor device having an irradiated region of given thickness, dosage and dosage gradient a given distance from a selected surface prepared according to claim 36 wherein:
in step A, the radiation source is selected from the group consisting of proton and alpha particle sources.

38. A semiconductor device having an irradiated region of given thickness, dosage and dosage gradient a given distance from a selected surface prepared according to claim 36 wherein:
in step A, the radiation source is a substantially monoenergetic source.

39. A semiconductor device having an irradiated region of given thickness, dosage and dosage gradient a given distance from a selected surface prepared according to claim 34 wherein:
in step A, the radiation source is selected from the group consisting of proton and alpha particle sources.

40. A semiconductor device having an irradiation region of given thickness, dosage and dosage gradient a given distance from a selected surface prepared according to claim 31 with the additional step of:
F. annealing the semiconductor device to reduce sensitivity of electrical characteristics of the irradiated portion of the device to changes in operating temperature.

41. A semiconductor device having an irradiated region of given thickness, dosage and dosage gradient a given distance from a selected surface prepared according to claim 40 wherein:
in step A, the radiation source is selected from the group consisting of proton and alpha particle sources.

42. A semiconductor device having an irradiated region of given thickness, dosage and dosage gradient a given distance from a selected surface prepared according to claim 40 wherein:
in step A, the radiation source is a substantially monoenergetic source.

43. A semiconductor device having an irradiated region of given thickness, dosage and dosage gradient a given distance from a selected surface prepared according to claim 41 wherein:
in step A, the radiation source is selected from the group consisting of proton and alpha particle sources.

44. A semiconductor device having an irradiated region of given thickness, dosage and dosage gradient a given distance from a selected surface prepared according to claim 40 with the additional step of:
G. masking selected portions of the semiconductor device against irradiation from said radiation source during step D.

45. A semiconductor device having an irradiated region of given thickness, dosage and dosage gradient a given distance from a selected surface prepared according to claim 44 wherein:
in step A, the radiation source is selected from the group consisting of proton and alpha particle sources.

46. A semiconductor device having an irradiated region of given thickness, dosage and dosage gradient a given distance from a selected surface prepared according to claim 44 wherein:
in step A, the radiation source is a substantially monoenergetic source.

47. A semiconductor device having an irradiated region of given thickness, dosage and dosage gradient a given distance from a selected surface prepared according to claim 46 wherein:
in step A, the radiation source is selected from the group consisting of proton and alpha particle sources.

48. A thyristor having in gating portions thereof an irradiated region of given thickness, dosage and dosage gradient a given distance from a selected surface prepared by:
  A. providing a radiation beam from a given radiation source radiating particles with molecular weight of at least one (1) capable of penetrating the thyristor through the selection surface to a depth greater than a maximum desired depth of the irradiated region;
  B. modifying the beam with a beam modifier of a given material and non-uniform shape to modify the energy of said radiation beam on transmission therethrough a transmitted radiation beam capable of forming an irradiated region of a desired thickness and dosage gradient in a gating portion of the thyristor the given distance from the selected surface with the transmitted radiation beam;
  C. positioning the thyristor with said selected surface adjoining said gating portion thereof to be exposed to the radiation beam from the radiation source on transmission through the beam modifier modifying the energy of the beam;
  D. masking at least part of the conducting portions of the thyristor against irradiation from said radiation source; and
  E. thereafter irradiating the gating portion of the thyristor through the beam modifier and through the selected surface to form in the gating portion the irradiated region of the desired thickness, dosage and dosage gradient the desired distance from the selected surface.

49. A thyristor having in gating portions thereof an irradiated region of given thickness, dosage and dosage gradient a given distance from a selected surface as set forth in claim 48 comprising in addition:
  F. moving the beam modifier and the semiconductor device relative to each other through a predetermined motion during the irradiated step.

50. A thyristor having in gating portions thereof an irradiated region of given thickness, dosage and dosage gradient a given distance from a selected surface prepared according to claim 49 wherein:
  in step A, the radiation source is selected from the group consisting of proton and alpha particle sources.

51. A thyristor having in gating portions thereof an irradiated region of given thickness, dosage and dosage gradient a given distance from a selected surface prepared according to claim 49 wherein:
  in step A, the radiation source is a substantially monoenergetic source.

52. A thyristor having in gating portions thereof an irradiated region of given thickness, dosage and dosage gradient a given distance from a selected surface prepared according to claim 51 wherein:
  in step A, the radiation source is selected from the group consisting of proton and alpha particle sources.

53. A thyristor having in gating portions thereof an irradiated region of given thickness, dosage and dosage gradient a given distance from a selected surface prepared according to claim 49 wherein:
  the selected surface of the thyristor through which irradiation is performed is adjacent a cathode-emitter region of the thyristor.

54. A thyristor having in gating portions thereof an irradiated region of given thickness, dosage and dosage gradient a given distance from a selected surface prepared according to claim 49 wherein:
  in step E, the irradiated portion formed in the gating portion of the thyristor is at least in part adjacent the PN junction between cathode-base and anode-base regions of the thyristor.

55. A thyristor having in gating portions thereof an irradiated region of given thickness, dosage and dosage gradient a given distance from a selected surface prepared according to claim 49 wherein:
  in step E, the irradiated portion formed in the gating portion adjacent the PN junction between anode-base and anode-emitter regions of the thyristor.

56. A method of forming an irradiated region having a selected thickness, dosage and dosage gradient at a selected depth from a selected surface thereof, in a given material, said method comprising:
  providing a radiation beam with particles with molecular weight of at least one with sufficient energy to penetrate the material through the selected surface and beyond the maximum depth of the irradiated region;
  attenuating said radiation beam with a beam modifier having at least one face that is sloped with respect to the direction of the beam such that the attenuated beam is of an energy to form an irradiated region of a selected depth, thickness, and dosage gradient in the material, and
  irradiating the selected surface of the material with the attenuated beam to form an irradiation region of a selected thickness, dosage and dosage gradient at a selected depth in the material.

57. A method as set forth in claim 56 wherein:
  the radiation source is selected from the group consisting of proton and alpha particle sources.

58. A method as set forth in claim 56 wherein:
  the radiation source is a substantially monoenergetic source.

59. A method as set forth in claim 58 wherein:
  the radiation source is selected from the group consisting of proton and alpha particle sources.

60. A method as set forth in claim 56 comprising in addition:
  moving the beam modifier and the material relative to each other through a predetermined motion during the irradiation step.

61. A method of forming an irradiated region having a selected thickness, dosage and dosage gradient and being at a selected depth from a selected surface thereof in a semiconductor body, said method comprising:
  providing a radiation beam having particles with molecular weight of at least one with sufficient energy to penetrate the semiconductor body through the selected surface to beyond the maximum depth of the irradiated region;
  attenuating the radiation beam with a beam modifier having at least one face that is sloped with respect to the direction of the beam such that the attenuated beam is of an energy to form an irradiated region of a selected depth, thickness, and dosage gradient in the semiconductor body; and
  irradiating the selected surface of the semiconductor body with the attenuated beam to form an irradiation region of a selected thickness, dosage and dosage gradient at a selected depth in the material.

62. A method of changing the electrical characteristics of a semiconductor body as set forth in claim 61 comprising in addition:

moving the beam modifier and the semiconductor body relative to each other through a predetermined motion during the irradiation step.

63. A method of changing the electrical characteristics of a semiconductor body as set forth in claim 62 wherein the radiation source is selected from the group consisting of proton and alpha particle sources.

64. A method of changing the electrical characteristics of a semiconductor body as set forth in claim 62 wherein the radiation source is a substantially monoenergetic source.

65. A method of changing the electrical characteristics of a semiconductor body as set forth in claim 64 wherein the radiation source is selected from the group consisting of proton and alpha particle sources.

66. A method of changing the electric characteristics of a semiconductor body as set forth in claim 61 comprising in addition:
   masking selected protons of the semiconductor body against irradiation from said radiation source.

67. A method of changing the electrical characteristics of a semiconductor body as set forth in claim 66 wherein the radiation source is selected from the group consisting of proton and alpha particle sources.

68. A method of changing the electrical characteristics of a semiconductor device as set forth in claim 66 wherein the radiation source is a substantially monoenergetic source.

69. A method of changing the electrical characteristics of a semiconductor body as set forth in claim 68 wherein the radiation source is selected from the group consisting of proton and alpha particle sources.

70. A method of changing the electrical characteristics of a semiconductor body as set forth in claim 61 comprising in addition:
   annealing the semiconductor device to reduce sensitivity of of electrical characteristics of the irradiated portion of the device to changes in operating temperature.

71. A method of changing the electrical characteristics of a semiconductor body as set forth in claim 70 wherein the radiation source is selected from the group consisting of proton and alpha particle sources.

72. A method of changing the electrical characteristics of a semiconductor body as set forth in claim 70 wherein the radiation source is a substantially monoenergetic source.

73. A method of changing the electrical characteristics of a semiconductor body as set forth in claim 72 wherein the radiation source is selected from the group consisting of proton and alpha particle sources.

74. A method of changing the electrical characteristics of a semiconductor body as set forth in claim 70 comprising in addition:
   masking selected portions of the semiconductor body against irradiation from said radiation source.

75. A method of changing the electrical characteristics of a semiconductor body as set forth in claim 74 wherein the radiation source is selected from the group consisting of proton and alpha particle sources.

76. A method of changing the electrical characteristics of a semiconductor body as set forth in claim 74 wherein the radiation source is a substantially monoenergetic source.

77. A method of changing the electrical characteristics of a semiconductor body as set forth in claim 76 wherein the radiation source is selected from the group consisting of proton and alpha particle sources.

78. A method of changing the electrical characteristics of a thyristor, said method comprising:
   providing a radiation beam having particles with molecular weight of at least one with sufficient energy to penetrate the thyristor through the selected surface to beyond the maximum depth of the irradiated region;
   attenuating the radiation beam with a beam modifier having at least one face that is sloped with respect to the direction of the beam such that the attenuated beam is of an energy to form an irradiated region of a selected depth, thickness, and dosage gradient in the gating portion of the thyristor;
   masking at least part of the conducting portions of the thyristor against irradiation from said radiation source; and
   irradiating the selected surface of the thyristor with the unmasked portions of the attenuated beam to form an irradiated region in the gating portion having a selected thickness, dosage and dosage gradient in the gating portion at a selected depth in the gating portions of the thyristor.

79. A method of changing the electrical characteristics of a thyristor as set forth in claim 78 comprising in addition:
   moving the beam modifier and thyristor relative to each other through a predetermined motion during the irradiation step.

80. A method of changing the electrical characteristics of a thyristor as set forth in claim 79 wherein the radiation source is selected from the group consisting of proton and alpha particle sources.

81. A method of changing the electrical characteristics of a thyristor as set forth in claim 79 wherein the radiation source is a substantially monoenergetic source.

82. A method of changing the electrical characteristics of a thyristor as set forth in claim 81 wherein the radiation source is selected from the group consisting of proton and alpha particle sources.

83. A method of changing the electrical characteristics of a thyristor as set forth in claim 78 wherein the selected surface of thyristor through which irradiation is performed is adjacent a cathod-emitter region of the thyristor.

84. A method of changing the electrical characteristics of a thyristor as set forth in claim 78 wherein the irradiated region formed in the gating portion of the thyristor is at least in part adjacent a PN junction between cathode-base and anode-base regions of the thyristor.

85. A method of changing the electrical characteristics of a thyristor as set forth in claim 78 wherein the irradiated region in the gating portion adjacent a PN junction between anode-base and anode-emitter regions of the thyristor.

86. A semiconductor device having an irradiation region of selected thickness, dosage and dosage gradient as selected depth from a selected surface, said device constructed by:
   providing a radiation beam having particles with molecular weight of at least one with sufficient energy to penetrate the material through the selected surface and beyond the maximum depth of the irradiated region;
   attenuating said radiation beam with a beam modifier having at least one face that is sloped with respect to the direction of the beam such that the attenuated beam is of an energy to form an irradiated region of a selected depth, thickness, and dosage gradient in the material; and irradiating the selected surface of the material with the attenuated beam to form a nuclear irradiation region of defect generation at a selected depth in the material, said region having a selected thickness, dosage and dosage gradient.

87. A semiconductor device having an irradiated region of given thickness, dosage and dosage gradient a given distance from a selected surface prepared according to claim 86 comprising in addition:

moving the beam modifier and the semiconductor device relative to each other through a predetermined motion during the irradiation step.

88. A semiconductor device having an irradiated region of given thickness, dosage and dosage gradient a given distance from a selected surface prepared according to claim 87 wherein the radiation source is selected from the group consisting of proton and alpha particle sources.

89. A semiconductor device having an irradiated region of given thickness, dosage and dosage gradient a given distance from a selected surface prepared according to claim 87 wherein the radiation source is a substantially monoenergetic source.

90. A semiconductor device having an irradiated region of given thickness, dosage and dosage gradient a given distance from a selected surface prepared according to claim 89 wherein the radiation source is selected from the group consisting of proton and alpha particle sources.

91. A semiconductor device having an irradiated region a given thickness, dosage and dosage gradient a given distance from a selected surface prepared according to claim 86 with the additional step of:

masking selected portions of the semiconductor device against irradiation from said radiation source.

92. A semiconductor device having an irradiated region of given thickness, dosage and dosage gradient a given distance from a selected surface prepared according to claim 91 wherein the radiation source is selected from the group consisting of proton and alpha particle sources.

93. A semiconductor device having an irradiated region of given thickness, dosage and dosage gradient a given distance from a selected surface prepared according to claim 91 wherein the radiation source is a substantially monoenergetic source.

94. A semiconductor device having an irradiated region of given thickness, dosage and dosage gradient a given distance from a selected surface prepared according to claim 89 wherein the radiation source is selected from the group consisting of proton and alpha particle sources.

95. A semiconductor device having an irradiation region of given thickness, dosage and dosage gradient a given distance from a selected surface prepared according to claim 86 with the additional step of:

annealing the semiconductor device to reduce sensitivity of electrical characteristics of the irradiated protion of the device to changes in operating temperature.

96. A semiconductor device having an irradiated region of given thickness, dosage and dosage gradient a given distance from a selected surface prepared according to claim 95 wherein the radiation source is selected from the group consisting of proton and alpha particle sources.

97. A semiconductor device having an irradiated region of given thickness, dosage and dosage gradient a given distance from a selected surface prepared according to claim 95 wherein the radiation source is a substantially monoenergetic source.

98. A semiconductor device having an irradiated region of given thickness, dosage and dosage gradient a given distance from a selected surface prepared according to claim 96 wherein the radiation source is selected from the group consisting of proton and alpha particle sources.

99. A semiconductor device having an irradiated region of given thickness, dosage and dosage gradient a given distance from a selected surface prepared according to claim 95 with the additional step of:

masking selected portions of the semiconductor device against irradiation from said radiation source.

100. A semiconductor device having an irradiated region of given thickness, dosage and dosage gradient a given distance from a selected surface prepared according to claim 99 wherein the radiation source is selected from the group consisting of proton and alpha particle sources.

101. A semiconductor device having an irradiated region of given thickness, dosage and dosage gradient a given distance from a selected surface prepared according to claim 99 wherein the radiation source is a substantially monoenergetic source.

102. A semiconductor device having an irradiated region of given thickness, dosage and dosage gradient a given distance from a selected surface prepared according to claim 101 wherein the radiation source is selected from the group consisting of proton and alpha particle sources.

103. A thyristor having in gating portions thereof an irradiated region of selected thickness, dosage and dosage gradient at a selected depth from a selected surface, said thyristor constructed by:

providing a radiation beam from a radiation source, said beam having particles with molecular weight of at least one with sufficient energy to penetrate the thyristor through the selected surface to beyond the maximum depth of the irradiated region;

attenuating the radiation beam with a beam modifier having at least one face that is sloped with respect to the direction of the beam such that the attenuated beam is of an energy to form an irradiated region of a selected depth, thickness, and dosage gradient in the gating portion of the thyristor;

masking at least part of the conducting portions of the thyristor against irradiation from said radiation source; and irradiating the selected surface of the thyristor with the unmasked portions of the attenuated beam to form an irradiation at a selected depth in the gating portions of the thyristor, said region in the gating portion having a selected thickness, dosage and dosage gradient in the gating portion.

104. A thyristor having in gating portions thereof an irradiated region of given thickness, dosage and dosage gradient a given distance from a selected surface as set forth in claim 103 comprising in addition:

moving the beam modifier and the semiconductor device relative to each other through a predetermined motion.

105. A thyristor having in gating portions thereof an irradiated region of given thickness, dosage and dosage gradient a given distance from a selected surface prepared according to claim 104 wherein the radiation source is selected from the group consisting of proton and alpha particle sources.

106. A thyristor having in gating portions thereof an irradiated region of given thickness, dosage and dosage gradient a given distance from a selected surface prepared according to claim 104 wherein the radiation source is a substantially monenergetic source.

107. A thyristor having in gating portions thereof an irradiated region of given thickness, dosage and dosage gradient a given distance from a selected surface prepared according to claim 106 wherein the radiation source is selected from the group consisting of proton and alpha particle sources.

108. A thyristor having in gating portions thereof an irradiated region of given thickness, dosage and dosage gradient a given distance from a selected surface prepared according to claim 104 wherein the selected surface of the thyristor through which irradiation is performed is adjacent a cathode-emitter region of the thyristor.

109. A thyristor having in gating portions thereof an irradiated region of given thickness, dosage and dosage gradient a given distance from a selected surface prepared according to claim 104 wherein the irradiated portion formed in the gating portion of the thyristor is at least in part adjacent the PN junction between cathode-base and anode-base regions of the thyristor.

110. A thyristor having in gating portions thereof an irradiated region of given thickness, dosage and dosage gradient a given distance from a selected surface prepared according to claim 104 wherein the irradiated portion formed in the gating portion adjacent the PN junction between anode-base and anode-emitter regions of the thyristor.

* * * * *